United States Patent [19]
Arakawa et al.

[11] Patent Number: 5,822,847
[45] Date of Patent: Oct. 20, 1998

[54] IC MOUNTING/DEMOUNTING SYSTEM AND A MOUNTING/DEMOUNTING HEAD THEREFOR

[75] Inventors: Isao Arakawa; Yosinori Hirata; Ryoichi Miyamoto, all of Kumamoto, Japan

[73] Assignee: Mitsubishi Denki Kabushiki Kaisha, Tokyo, Japan

[21] Appl. No.: 782,672

[22] Filed: Jan. 15, 1997

[30] Foreign Application Priority Data

May 29, 1996 [JP] Japan .................................. 8-135495

[51] Int. Cl.⁶ .......................... H05K 3/30; H05K 13/04
[52] U.S. Cl. ................. 29/741; 29/740; 29/743; 294/2; 901/40
[58] Field of Search .................... 29/739, 740, 743, 29/760, DIG. 44; 294/2, 64.1, 106; 901/40

[56] References Cited

U.S. PATENT DOCUMENTS

| | | | |
|---|---|---|---|
| 4,515,507 | 5/1985 | Asai et al. .............................. | 9/743 X |
| 4,770,599 | 9/1988 | Hawkswell ............................ | 901/40 X |
| 4,810,018 | 3/1989 | Van De Ven et al. .................... | 29/740 |
| 4,908,092 | 3/1990 | Koibuchi ............................... | 29/743 X |
| 4,980,971 | 1/1991 | Bartschat et al. ..................... | 29/740 X |
| 5,667,129 | 9/1997 | Morita et al. .......................... | 228/102 |

FOREIGN PATENT DOCUMENTS

| | | |
|---|---|---|
| 62-18088 | 1/1987 | Japan . |
| 63-10473 | 1/1988 | Japan . |

*Primary Examiner*—Peter Vo
*Assistant Examiner*—Rick Kiltae Chang
*Attorney, Agent, or Firm*—Leydig, Voit & Mayer

[57] ABSTRACT

The IC mounting/demounting system of the present invention makes it possible to adjust the interval between socket pushers 42 and 43 of mounting/demounting head 25 in accordance with the size of IC socket 1A. Therefore, it is unnecessary to replace mounting/demounting head 25 when changing types of IC's and therefore, the operation efficiency is greatly improved.

14 Claims, 22 Drawing Sheets

IC MOUNTING/DEMOUNTING SYSTEM AND A MOUNTING/DEMOUNTING HEAD THEREFOR

BACKGROUND OF THE INVENTION

1. Field of the Invention

The present invention relates to an IC mounting/demounting system for transferring an IC on a tray and mounting the IC on an IC socket on a socket board for a burn-in process or demounting the IC from the IC socket and transferring the IC on the tray.

2. Description of the Related Art

Conventionally, a fabricated IC (IC package) passes through a burn-in process turned on for a predetermined time at a high temperature of, for example, 120° to 130° C. and thereafter, undergoes an electrical operation test.

In the burn-in process, an IC is mounted on each of a plurality of IC sockets arranged on a socket board, that is, the IC is electrically connected with the IC socket, and the socket board is set in a burn-in oven. Therefore, a process for transferring an IC to an IC socket on a socket board and mounting/demounting the IC on or from the IC socket is necessary before and after a burn-in process and an IC mounting/demounting system is used for the process.

FIG. 34 is a perspective view showing a conventional IC mounting/demounting system. In FIG. 34, socket board (burn-in board) 1 on which a plurality of IC sockets (not illustrated) are mounted is transferred one by one from board magazine 3 by board transfer section 2. Tray housing section 5 in which a plurality of trays 4 are housed is set nearby board transfer section 2. A plurality of IC's (not illustrated) are mounted on each tray 4.

IC's are transferred between socket board 1 and tray 4 by robot body 6. Two mounting/demounting heads 7 for sucking and holding an IC are mounted on robot body 6. The interval between these two mounting/demounting heads 7 can be adjusted in accordance with the pitch between IC sockets on socket board 1 and the pitch between IC's housed in tray 4. Moreover, tray chuck 8 for transferring tray 4 is mounted on robot body 6.

Next, operations will be described below. For example, to mount IC's on tray 4 housed in tray housing section 5 on IC sockets on socket board 1, mounting/demounting heads 7 are moved onto the IC on tray 4 by robot body 6 to suck two IC's. Thereafter, mounting/demounting heads 7 are moved over the IC sockets on socket board 1 to mount IC on the IC sockets and cancel the suction.

In this case, because an IC socket is provided with a cover for opening/closing the contacts, an IC is set to the IC socket by pressing the cover with the mounting/demounting head and thereby opening the contacts. Then, by moving the mounting/demounting head 7 upward, the pressure on the cover is released, the contacts are closed, and the IC is held by the IC socket. Moreover, an IC is positioned in mounting/demounting head 7 by correcting the shoulder portions of the IC by chucks (not illustrated) from four directions.

Thus, IC's are mounted by two on the IC sockets on socket board 1 from tray 4. When an IC is mounted on every IC socket on socket board 1, the next socket board 1 is supplied by board transfer section 2. When all the IC's are removed from tray 4, a new tray 4 is supplied by tray chucking section 8.

As described above, a burn-in process is carried out after the socket board with IC's mounted on the IC sockets is placed in a burn-in oven (not illustrated). After the burn-in process, the IC's on IC sockets are transferred to tray 4 by reversing the above procedure.

In the case of a conventional IC mounting/demounting system constituted as described above, it is necessary to position an IC with a chuck and press the covers of an IC socket by the socket holder (not illustrated) of a mounting/demounting head. However, because various sizes of IC sockets are used corresponding to the IC to be mounted, it is necessary to store various mounting/demounting heads having a socket holder corresponding to each IC socket size and a chuck corresponding to an IC size and to replace the whole of mounting/demounting head unit whenever the type of IC and IC socket are changed. To perform the above mounting/demounting head replacement, operations of the system must be stopped for 15 to 20 min or more thereby lowering operation efficiency. Particularly, as the number of diversified low-volume products increases, the frequency of mounting/demounting head replacement increases and the time and labor required for the replacement greatly influence operation efficiency.

There is a system for simultaneously transferring a lot of IC's by a robot having a plurality of mounting/demounting heads corresponding to only IC's and IC sockets of specific sizes. However, the system is also unsuitable for the above diversified low-volume product manufacture because the whole system must be stopped while the different size IC's and IC sockets are handled.

SUMMARY OF THE INVENTION

The present invention is made to solve the above problems and its object is to provide an IC mounting/demounting system for greatly improving the operation efficiency by eliminating the mounting/demounting head replacement time.

An IC mounting/demounting system of the present invention comprises a tray supply section for supplying a tray on which an IC is mounted, a board supply section for supplying a socket board having an IC socket for mounting an IC by pressing and displacing an IC socket moving section, a robot body for transferring the IC between the tray supplied to the tray supply section and the socket board supplied to the board supply section, and a mounting/demounting head having a plurality of socket pushers whose intervals can be adjusted to correspond to the size of the IC socket for pressing the IC-socket moving section and which is supported by the robot body to suck and hold the IC, and a control section for controlling operations of the robot body.

Moreover, the mounting/demounting head of the IC mounting/demounting system of the present invention comprises an sucking section supported by a robot body to suck an IC and a pair of socket pushers which are set outside of the sucking section and whose interval can be adjusted to press the IC-socket moving section when mounting or demounting the IC on or from the IC socket.

DESCRIPTION OF THE PREFERRED EMBODIMENTS

Embodiments of the present invention are described below by referring to the accompanying drawings.

EMBODIMENT 1

Figure 1:
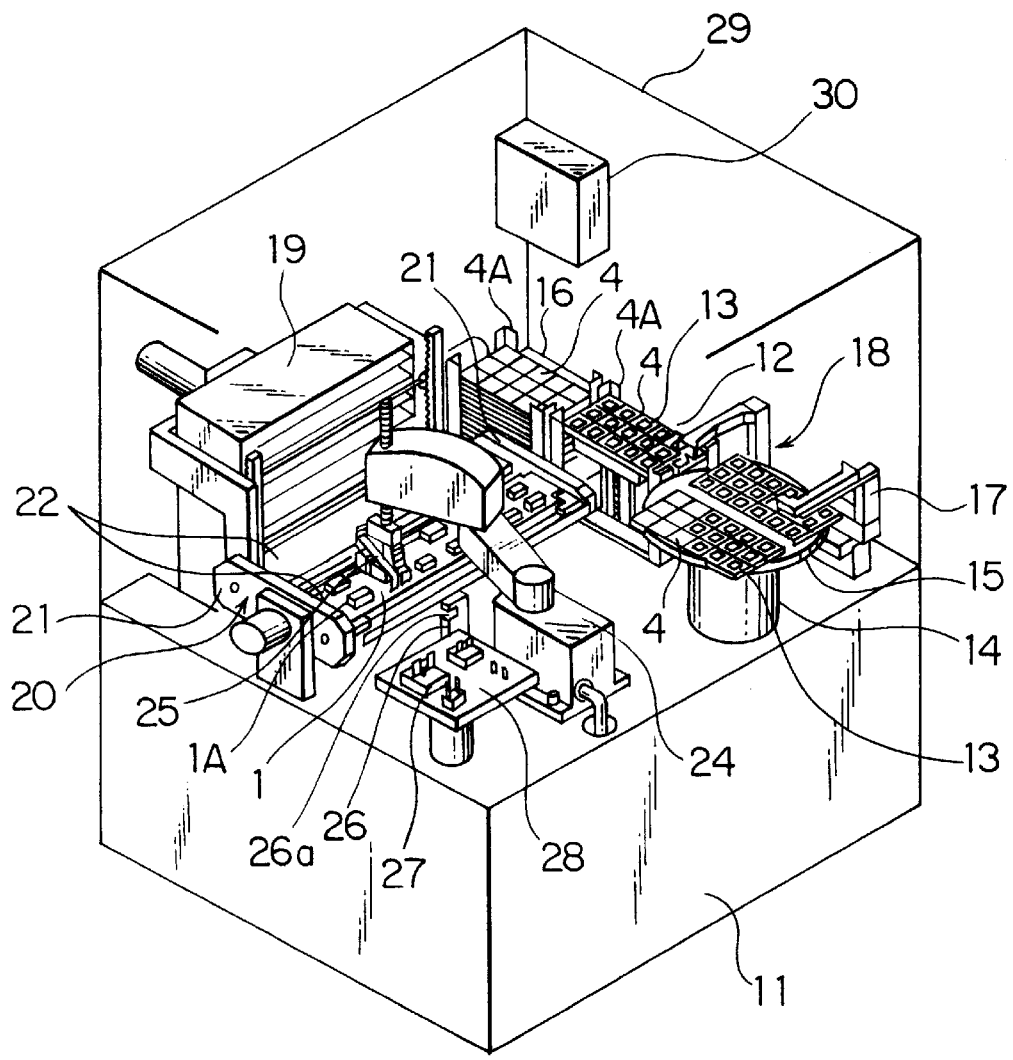
FIG. 1 is a perspective view showing an IC mounting/demounting system of embodiment 1 of the present invention.
Figure 2:
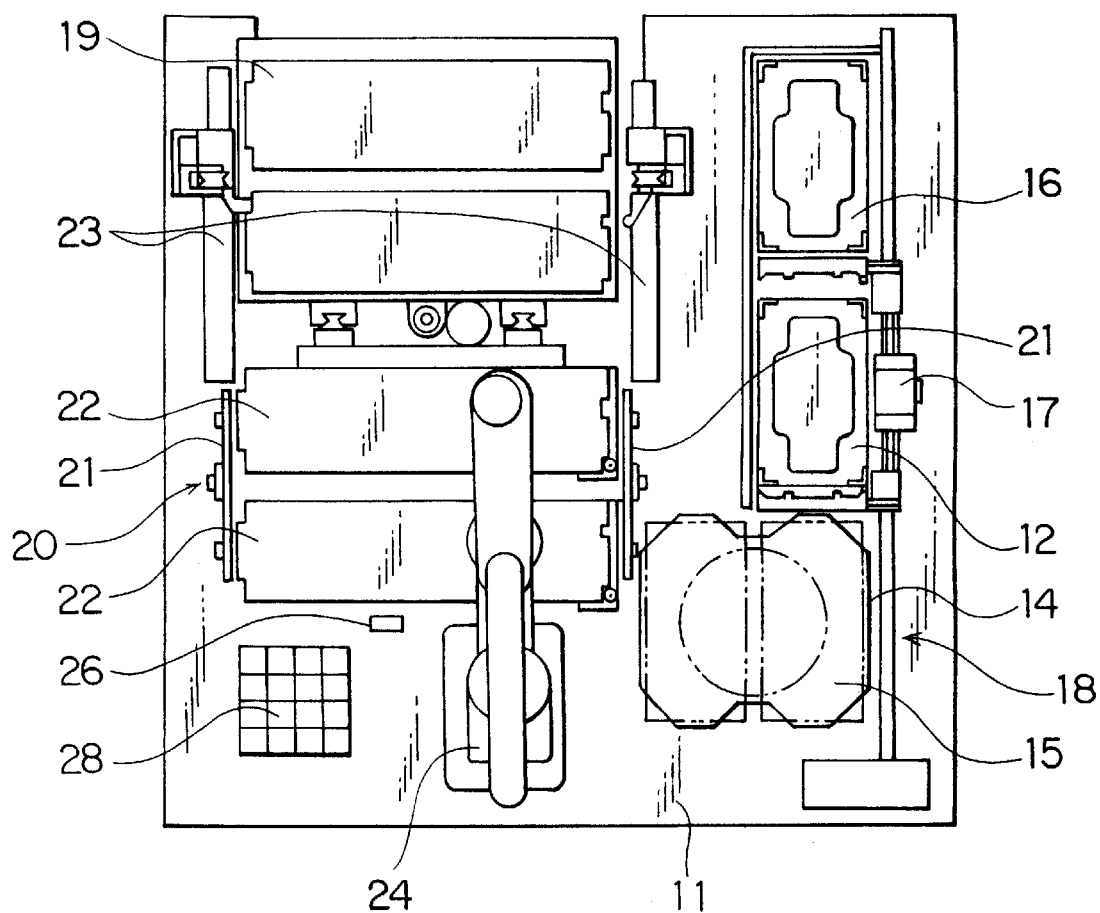
FIG. 2 is a top view of the system in FIG. 1.

FIG. 1 is a perspective view showing the IC mounting/demounting system of embodiment 1 of the present invention and FIG. 2 is a top view of the system in FIG. 1. Tray lifting unit 12 for slowly lifting and supplying a plurality of set trays 4 is set on setting table 11. Each tray 4 is constituted so that a plurality of IC's (IC packages) 13 can be positioned and mounted. Tray table 14 to which trays 4 on tray lifting unit 12 are transferred is provided adjacently to one side of tray lifting unit 12. Tray table 14 has a rotatable tray receiver 15 for supporting two trays 4. By rotating tray receiver 15 up to 180°, it is possible to mutually exchange the positions of two trays 4 on tray receiver 15.

Empty tray housing section 16 for housing an empty tray 4 is provided adjacent to the other side of tray lifting unit 12. Tray 4 is transferred between tray lifting unit 12, tray table 14, and empty tray housing section 16 by tray transfer unit 17. Tray supply section 18 comprises tray lifting unit 12, tray table 14, empty tray housing section 16, and tray transfer unit 17.

Substrate housing unit 19 housing a plurality of socket boards (burn-in boards) so that they can be moved vertically is connected to a predetermined position of setting table 11. Substrate reversing unit 20 serving as a board supply section is set on setting table 11. Substrate reversing unit 20 has a pair of rotary holders 21 rotatable about a shaft parallel with the upper side of setting table 11 and two board support tables 22 for supporting socket board 1 set between these rotary holders 21. By rotating rotary holders 21, the positions of two board support tables 22 can be mutually exchanged while keeping socket board 1 horizontal. Socket board 1 is transferred between board housing unit 19 and board reversing unit 20 by board transfer unit 23 set on setting table 11 as shown in FIG. 2 (omitted in FIG. 1).

Moreover, robot body 24 for transferring IC 13 between tray 4 on tray table 14 and socket board 1 on board reversing unit 20 is set on setting table 11. Mounting/demounting head 25 for sucking and holding IC 13 is movably supported vertically by robot body 24. Moreover, positioning member 26 having a recess 26a and centering jig stocker 28 on which a plurality of centering jigs 27 are mounted are set in the moving range of mounting/demounting head 25 by robot body 24. Operation panel 30 is secured to transparent cover 29 set on setting table 11. A control section (not illustrated) having a sequence controller to control the whole operation of the system is housed in setting table 11 and operation panel 30 is connected to the control section.

Next, basic operations of the whole system will be described below. First, tray magazine 4A in which a plurality of trays 4 with IC's 13 mounted are stacked is set in tray lifting unit 12 and an empty tray magazine 4A is set in an empty tray housing unit 16. Moreover, board housing unit 19 housing a plurality of socket boards 1 are set at a predetermined position.

Thereafter, operations are started by operating operation panel 30. In tray lifting unit 12, trays 4 in tray magazine 4A are slowly lifted and the top tray 4 is transferred to tray receiver 15 of tray table 14 by tray transfer unit 17. Substrates in board housing unit 19 are transferred onto board reversing unit 20. In the above state, mounting/demounting head 25 is moved onto tray 4 on tray receiver 15 by robot body 24 and one IC 13 is sucked by mounting/demounting head 25. The sucked IC 13 is thereby positioned and held by mounting/demounting head 25. Thereafter, mounting/demounting head 25 holding IC 13 is moved onto socket board 1 of board reversing unit 20 and lowered onto IC socket 1A. Then, the transferred IC 13 is mounted on IC socket 1A.

After the above operations are repeated and an IC 13 is mounted on every socket 1A on socket board 1, the positions of two socket boards 1 of board reversing unit 20 are exchanged with each other and IC's 13 are mounted on IC socket 1A on the next socket board 1. While IC's are being mounted on the next socket board 1, the finished socket board 1 is housed in board housing unit 19 and a new socket board 1 is transferred onto empty board support table 22 and positioned. After operations for every socket board 1 in board housing unit 19 are completed, board housing unit 19 is separated from setting table 11 and transferred to the next process.

Moreover, when every IC 13 is removed from a tray 4 on tray receiver 15, tray receiver 15 is rotated up to 180° and IC's 13 are transferred from the next tray 4. While operations for the next tray 4 are performed, empty tray 4 on tray receiver 15 is transferred into tray magazine 4A of empty tray housing section 16 by tray transfer unit 17 and a new tray 4 is transferred to a waiting portion on tray receiver 15 from tray lifting unit 12.

Because socket boards 1 are immediately replaced by board reversing unit 20 and trays 4 are immediately replaced by tray table 14, there is no downtime of the system for then replacement to improve operation efficiency.

The operations for extracting an IC 13 from IC socket 1A on socket board 1 and returning it to tray 4 are performed by reversing the above procedure.

Figure 3:
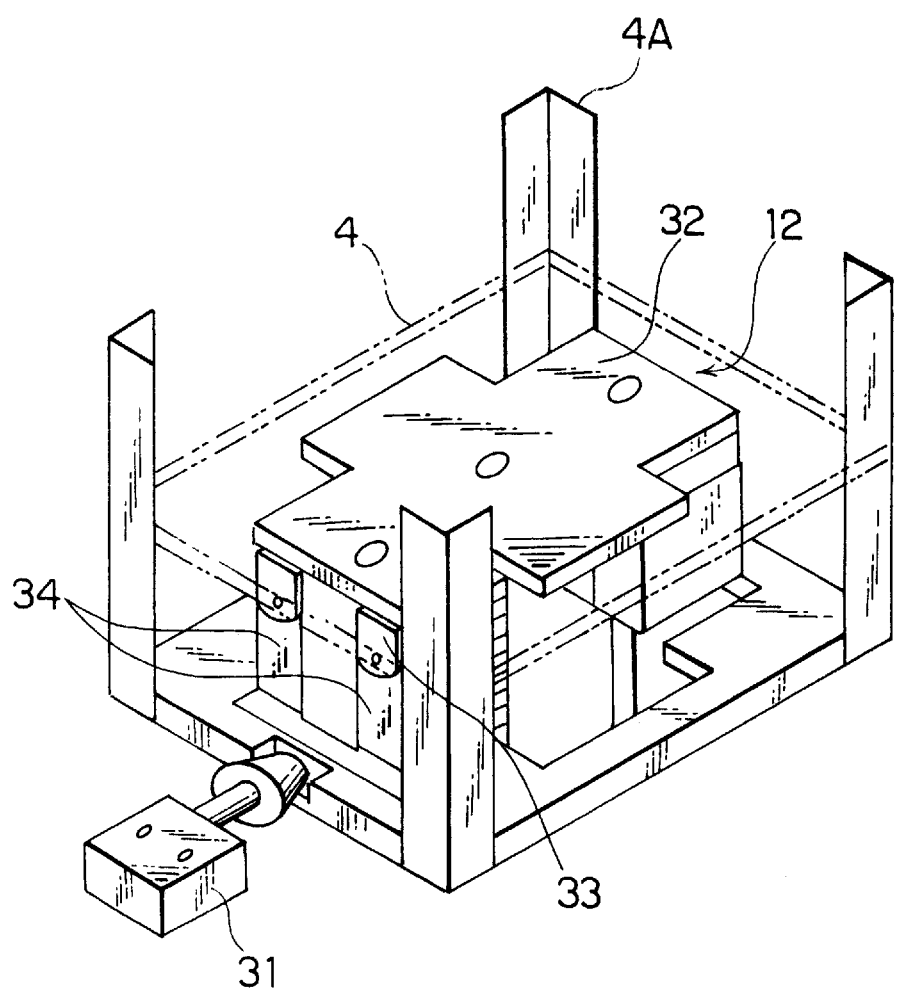
FIG. 3 is a perspective view showing the tray lifting unit in FIG. 1.
Figure 4:
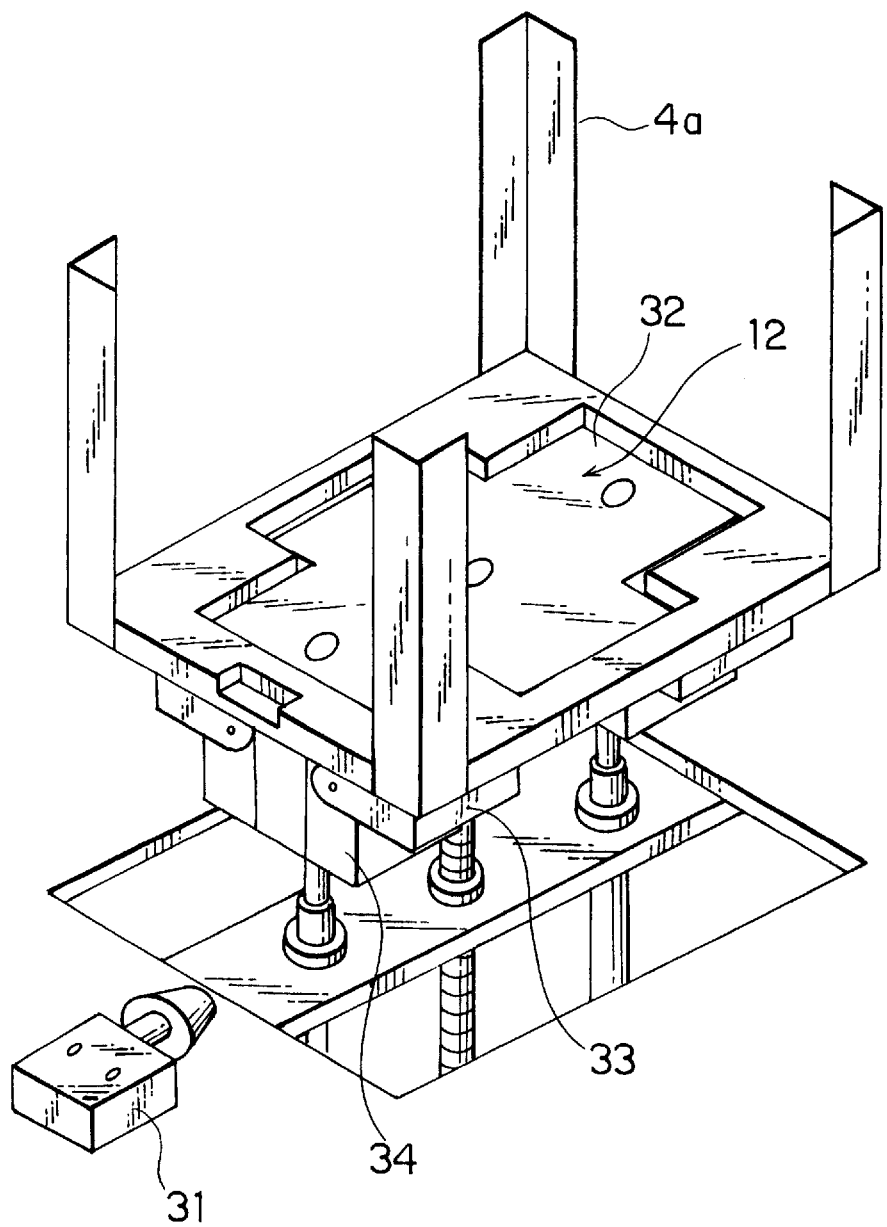
FIG. 4 is a perspective view showing a state in which the tray magazine in FIG. 3 is lifted.

Next, each section of the IC mounting/demounting system in FIG. 1 will be described below in detail. FIG. 3 is a perspective view showing tray lifting unit 12 in FIG. 1. Tray lifting unit 12 has a magazine holding cylinder 31 for holding tray magazine 4A set at a predetermined position, lifting table 32 for lifting tray 4 in tray magazine 4A, L-type engaging member 33 movably set in lifting table 32 to engage with tray magazine 4A, and engaging member cylinder 34 for rotating engaging member 33 up to 90.

In the case of the above tray lifting unit 12, as shown in FIG. 3, tray magazine 4A is held at a predetermined position by magazine holding cylinder 31 and lifting table 32 is raised while engaging member 33 is closed, and thereby trays 4 stacked in tray magazine 4A are lifted one by one. Then, trays 4 are transferred to tray table 14 by tray transfer unit 17 in order starting with the top tray.

After all the trays 4 in tray magazine 4A are transferred, lifting table 32 is once lowered to the lowest position, magazine holding cylinder 31 is released, and engaging member 33 is rotated up to 90. In the above state, by raising lifting table 32 rises, engaging member 33 thereby engages with the bottom of tray magazine 4A and empty tray magazine 4A is lifted up to a predetermined height.

Thus, by replacing tray magazines 4A while they are lifted to a predetermined height, they can be prevented from colliding with other units and replacement is simplified.

Figure 5:
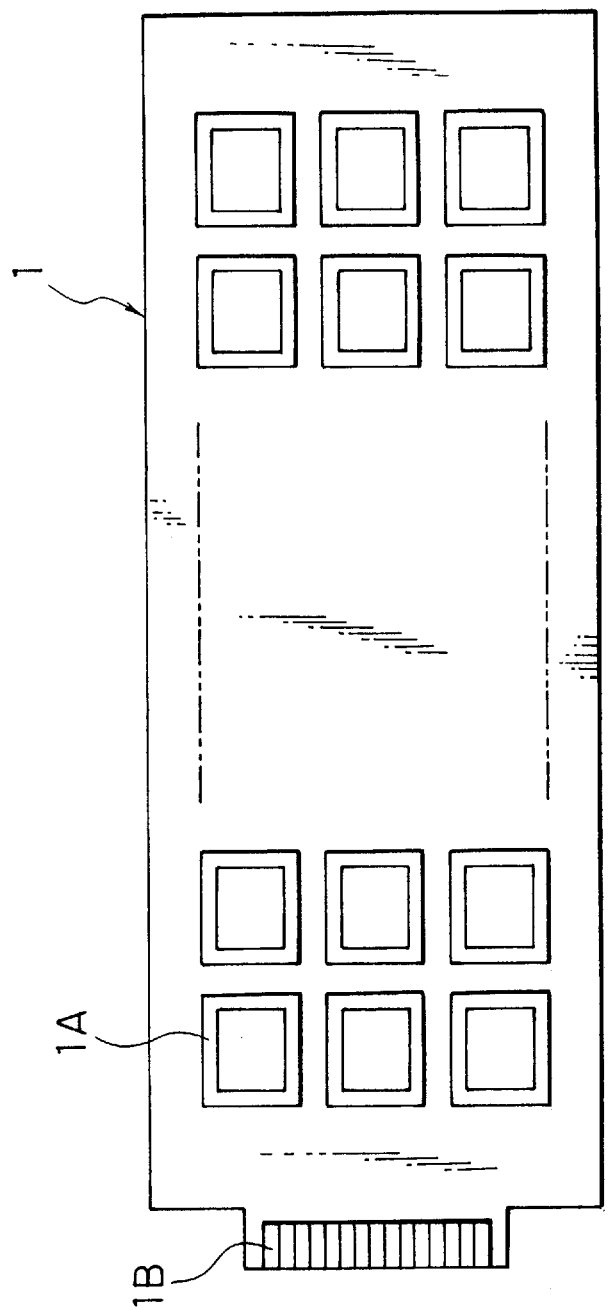
FIG. 5 is a top view showing a socket board.

FIG. 5 is a top view showing an example of a socket board 1. In FIG. 5, a plurality of IC sockets 1A are arranged on socket board 1 and wiring patterns (not illustrated) for electrifying these IC sockets 1A are formed on socket board 1. Moreover, connector 1B inserted into and electrically connected with a joint in a burn-in oven (not illustrated) is provided at one end of socket board 1.

Figure 6:
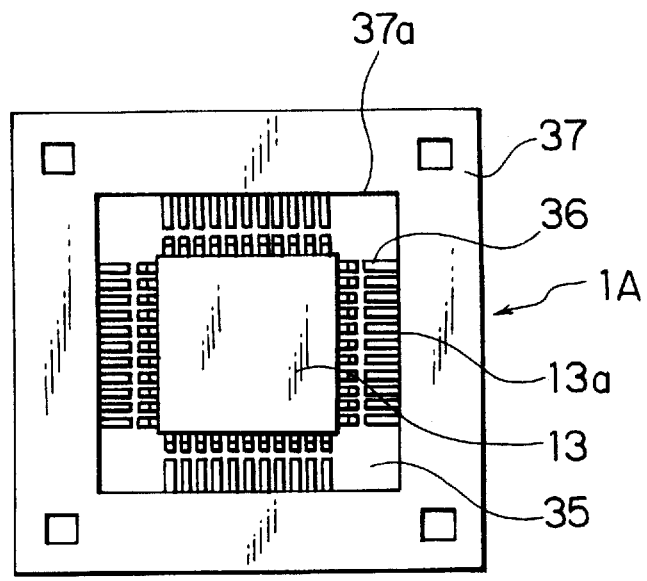
FIG. 6 is a top view showing an IC socket.
Figure 7:
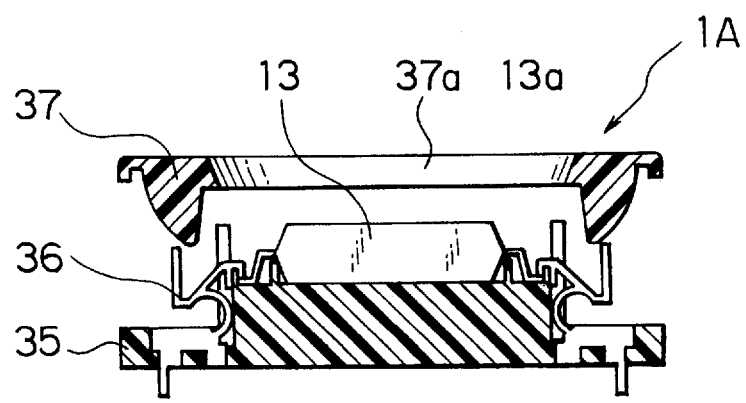
FIG. 7 is a sectional view of the IC socket in FIG. 7.
Figure 8:
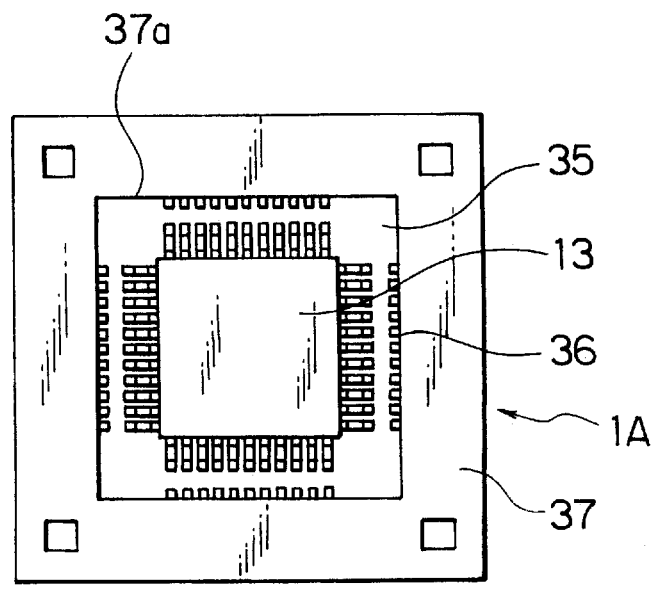
FIG. 8 is a top view showing a state in which the cover in FIG. 6 is pressed.
Figure 9:
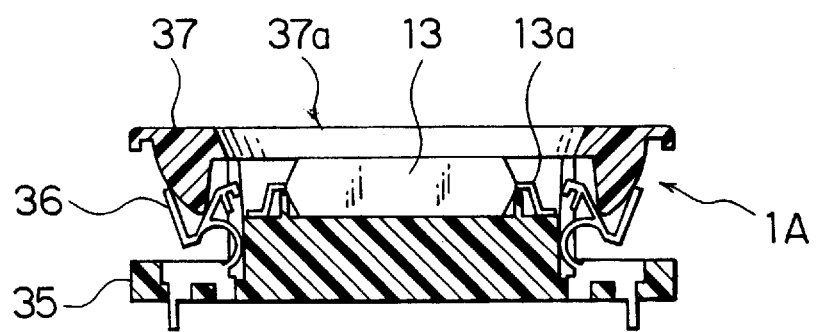
FIG. 9 is a sectional view of the cover in FIG. 8.

FIG. 6 is a top view showing an example of an IC socket 1A, FIG. 7 is a sectional view of IC socket 1A in FIG. 6, FIG. 8 is a top view showing a state in which the cover in FIG. 6 is pressed, and FIG. 9 is a sectional view of the cover in FIG. 8. A plurality of contact pins 36 which can be elastically deformed are set on base 35 of IC socket 1A correspondingly to lead 13a of IC 13.

Each contact pin 36 presses lead 13a from the top by its elasticity. Moreover, cover 37 serving as a moving section engaging with all contact pins 36 is set on base 35. Opening 37a for passing IC 13 is formed at the central portion of cover 37.

In the case of the above type of IC socket 1A, cover 37 is uniformly pressed by mounting/demounting head 25 (FIG. 1) when IC 13 is mounted or demounted. Every contact pin 36 is thereby elastically deformed and leads 13a are released as shown in FIG. 9. When the pressure of cover 37 is released, cover 37 moves upward, contact pins 36 return to their original shape, and leads 13a are pressed by contact pins 36. On this way, leads 13a are electrically connected with contact pins 36.

Figure 10:
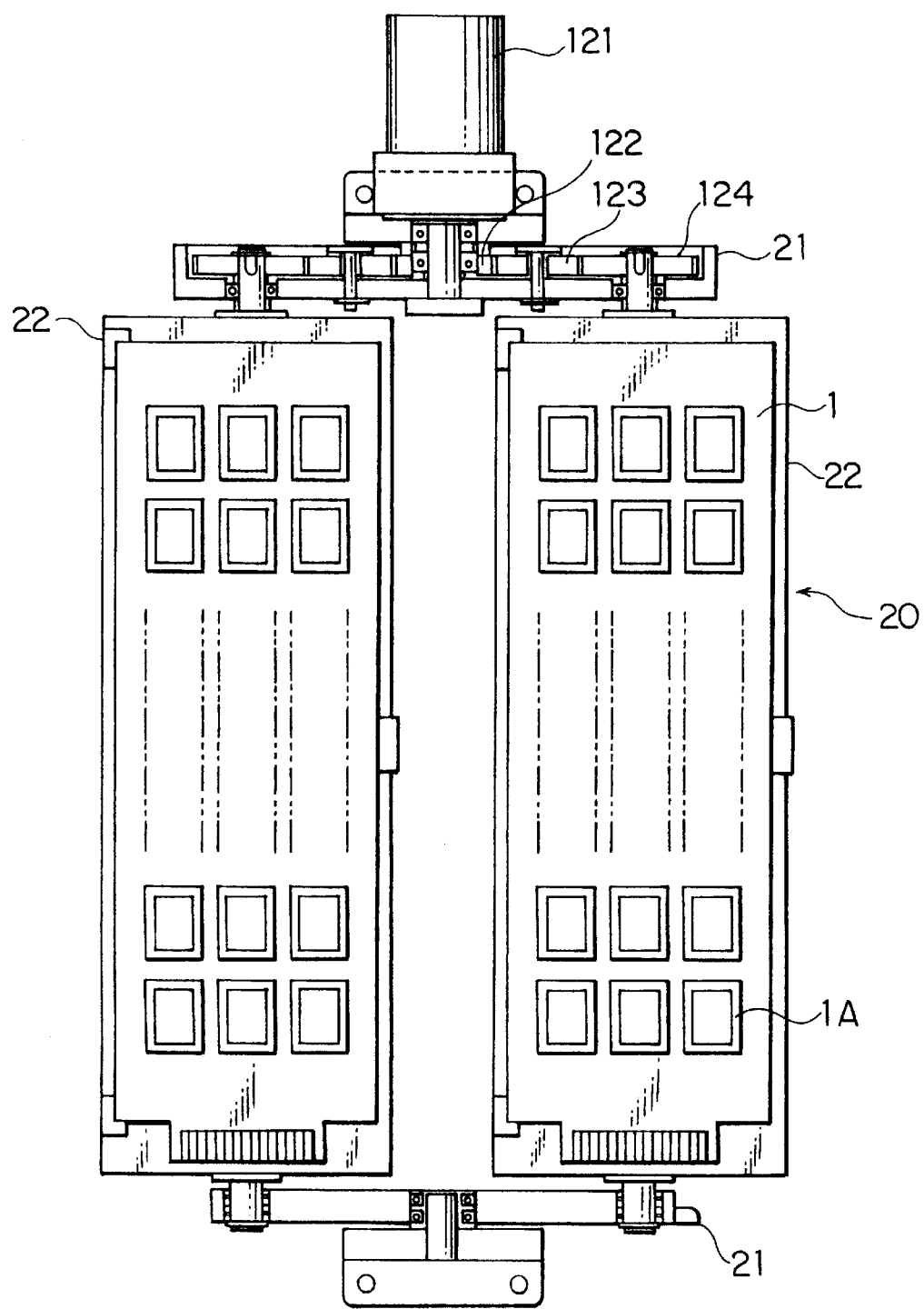
FIG. 10 is a top view showing the board reversing unit in FIG. 1.
Figure 11:
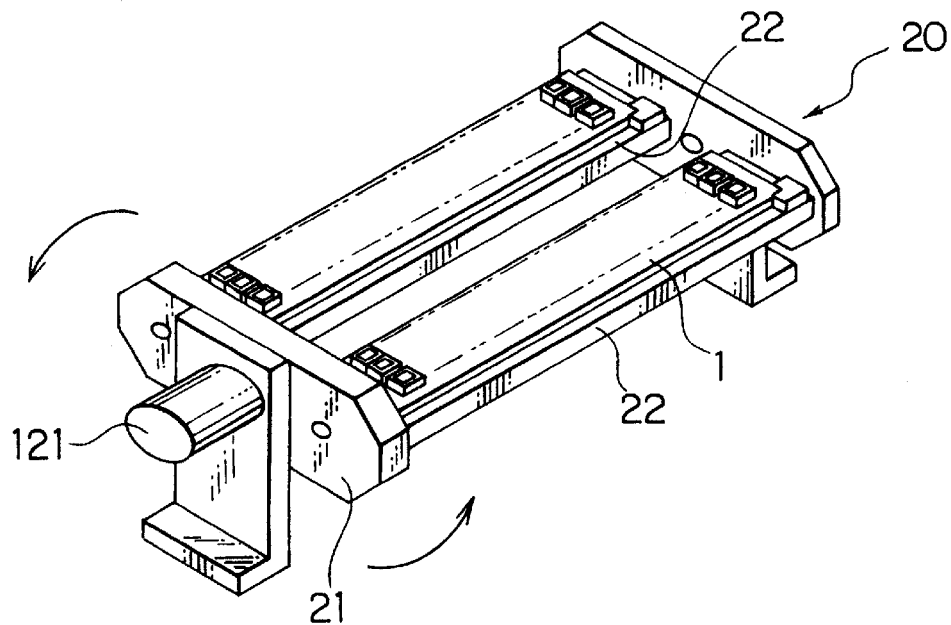
FIG. 11 is a perspective view of the board reversing unit in FIG. 10.
Figure 12:
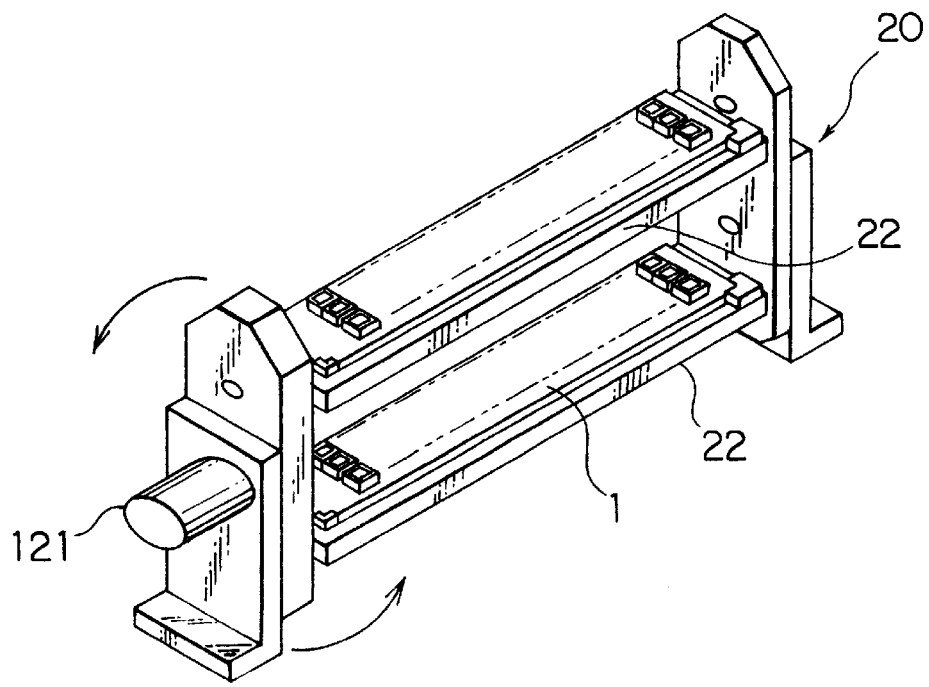
FIG. 12 is a perspective view showing a state in which the system in FIG. 10 is reversing the socket boards.

FIG. 10 is a top view showing board reversing unit 20 in FIG. 1, FIG. 11 is a perspective view of unit 20 in FIG. 10, and FIG. 12 is a perspective view showing a state in which the system in FIG. 10 currently reverses a socket board. In these drawings, rotary holder 21 is rotated by driving motor 121 for exchanging the positions of two board support tables 22 with each other. In this case, two idler gears 123 engaging with fixed gear 122 fixed to the support portion of driving motor 121 move around fixed gear 122 while rotating on their own axis. Horizontal holding gear 124 secured to board support table 22 engages with these idler gears 123 and the number of teeth of the gear 124 is set so that socket board 1 on board support table 22 is kept horizontal.

By using the above board reversing unit 20, it is possible to exchange positions of socket boards 1 by a simple structure while keeping socket boards 1 horizontal, eliminate the downtime due to replacement of socket boards 1, and improve the operation efficiency.

Figure 13:
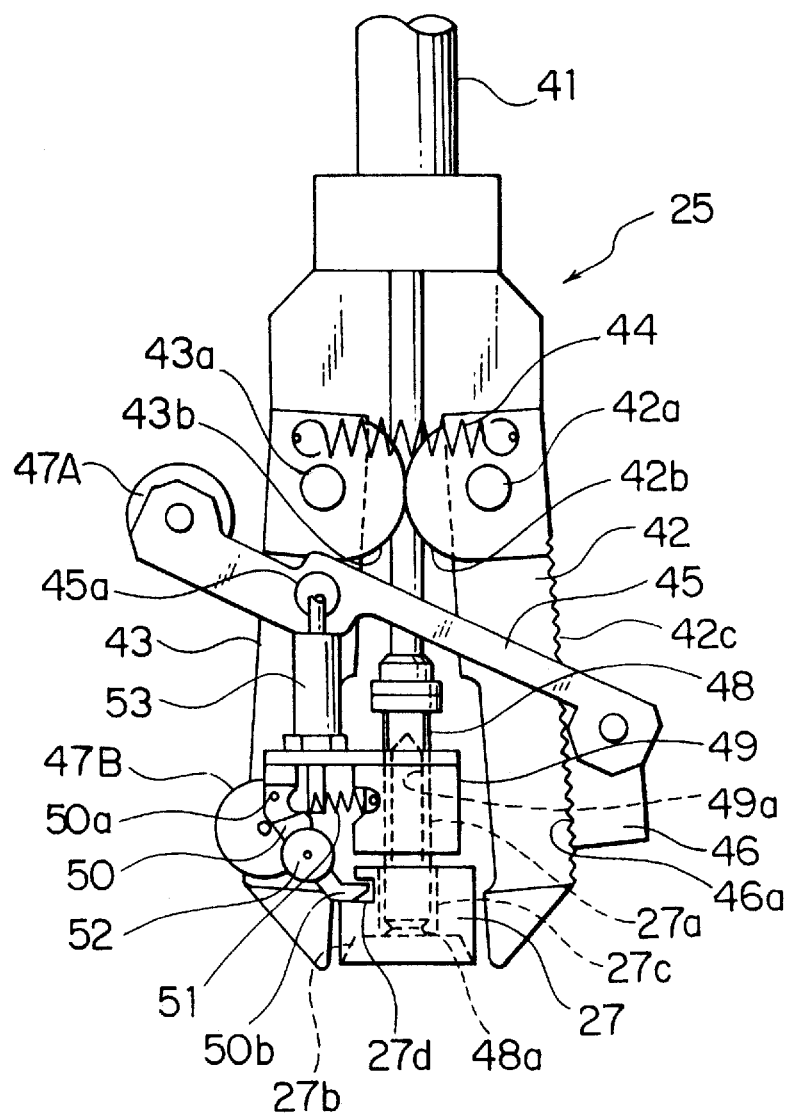
FIG. 13 is a front view showing the mounting/demounting head in FIG. 1.

Next, the structure of mounting/demounting head 25 will be described below. FIG. 13 is a front view showing the mounting/demounting head 25 in FIG. 1. In FIG. 13, a pair of socket pushers for pressing cover 37 of IC socket 1A, that is, first and second socket pushers 42 and 43 are set at the bottom end of head shaft 41 to be movably supported vertically by robot body 24 so that holders 42 and 43 can rotate about fulcrums 42a and 43a. First and second socket pushers 42 and 43 are provided with timing gears 42b and 43b which engage each other when holders 42 and 43 rotate. Moreover, first socket pusher 42 is provided with engagement surface 42c on which fine grooves with a triangular cross section are continuously formed.

First and second socket pushers 42 and 43 are pressed by spring 44 in the direction for the separating bottom ends of holders 42 and 43 from each other. Lever 45 is set to second socket pushers 43 so as to be rotatable about fulcrum 45a.

Stopper 46 serving as an interval control member for controlling the rotation of first and second socket pusher 42 and 43 in the opening direction is rotatably set to one end of lever 45. Moreover, stopper 46 is provided with engagement surface 46a engaging with engagement surface 42c of first socket pusher 42. Moreover, by rotating lever 45 to adjust the position of stopper 46 in the longitudinal direction of first stopper holder 42, the interval between the bottom ends of first and second socket pushers 42 and 43, that is, the opening degree between holders 42 and 43 can be adjusted. The other end of lever 45 is provided with first rotatable roller 47A. Second lever 43 is provided with second rotatable roller 47B.

A suction tube 48 serving as a sucking section extending in the axial direction of head shaft 41 is set between first and second socket pushers 42 and 43. The front end of suction tube 48 is provided with suction pad 48a for sucking IC 31. Stationary table 49 is secured to a housing (not illustrated) fixed to head shaft 41 and centering jig 27 is set to stationary table 49.

Figure 14:
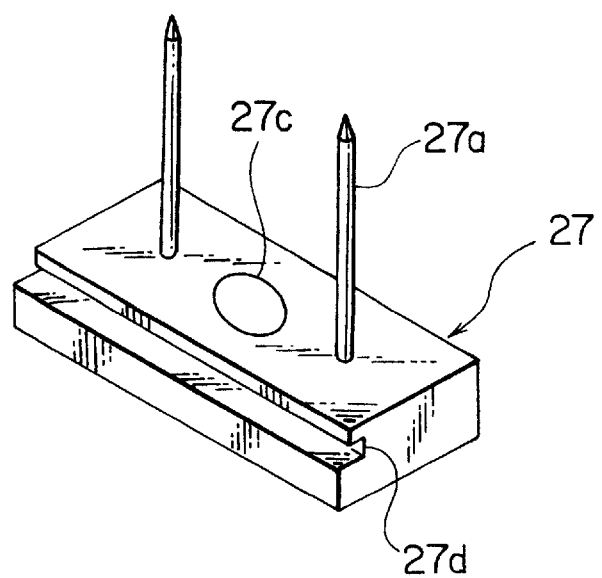
FIG. 14 is a perspective view showing a centering jig.

FIG. 14 is a perspective view showing an example of centering jig 27. Centering jig 27 is provided with two positioning pins 27a, which are positioned by inserting them into the positioning holes 49a formed on stationary table 49.

The bottom of centering jig 27 is provided with recess 27b having a tapered wall portion. The front end of suction tube 48 is inserted into hole 27c of centering jig 27 and the front end of suction pad 48a opens in recess 27b. Therefore, IC 13 sucked by suction pad 48a is sucked into recess 27a and thereby, automatically centered by the tapered wall portion of recess 27b. Moreover, as shown in FIG. 1, various centering jigs 27 are put on centering-jig stocker 28 and they can be changed to correspond to the size of an IC 13.

Stationary table 49 is provided with chuck 50 rotatable about fulcrum 50a and front end 50b of chuck 50 engages with engagement groove 27d of centering jig 27 to hold centering jig 27. Chuck 50 is pressed by spring 51 in the direction for engaging front end 50b of chuck 50 with engagement groove 27d. Chuck release roller 52 is rotatably set to the middle of chuck 50. Moreover, air cylinder 53 for rotating chuck 50 against spring 51 by pressing chuck release roller 52 is mounted on stationary table 49.

In the case of the above described mounting/demounting head 25, IC 13 is positioned by centering jig 27 and sucked and held by suction pad 48a. Therefore, when IC 13 is taken out of tray 4, mounting/demounting head 25 is moved by robot body 24 and lowered at an accurate position and in an accurate direction to IC socket 1A.

In this case, because the opening degree between first and second socket pushers 42 and 43 is previously adjusted, cover 37 of IC socket 1A is pressed by socket pushers 42 and 43 and contact pins 36 are elastically deformed as shown in FIG. 9. In the above state, the suction of IC 13 is released and mounting/demounting head 25 is lifted to thereby restore contact pins 36 and set IC 13 to IC socket 1A. IC 13 is removed from socket 1A by reversing this setting procedure.

Figure 15:
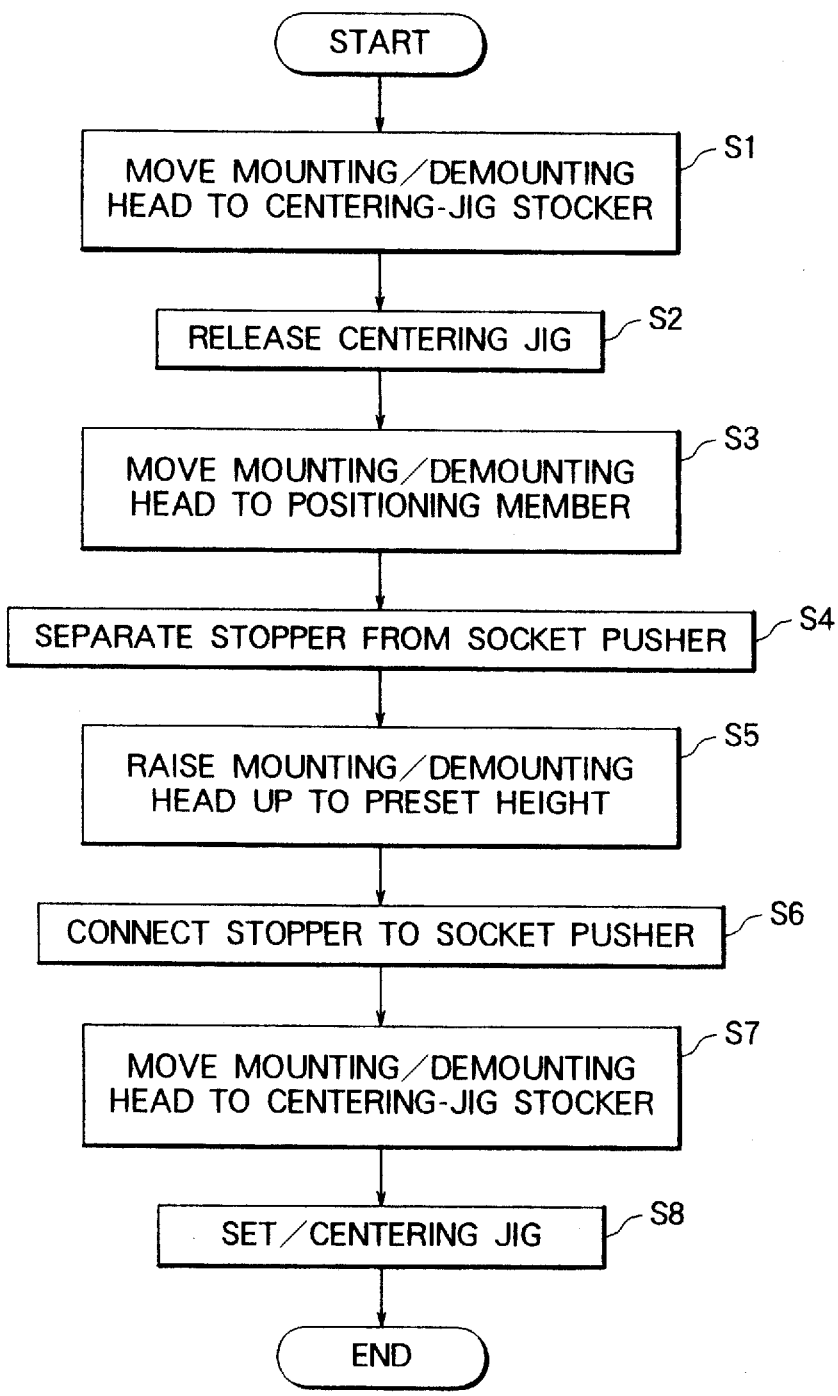
FIG. 15 is a flow chart showing the operating procedure when the IC mounting/demounting system in FIG. 1 changes types of products.

Next, operations of an IC mounting/demounting system when the type of IC 13 used is changed will be described below. FIG. 15 is a flow chart showing the operating procedure when there is a type of product change in the IC mounting/demounting system in FIG. 1. First, an operator inputs a command for type-of-product change operation at operation panel 30 as well as the necessary information regarding such data as the type of IC, IC socket to be used, etc. The robot body 24 is thereby controlled to move the mounting/demounting head 25 to centering-jig stocker 28 (step S1). The storage position of each centering jig 27 in centering-jig stocker 28 is previously stored in the memory of the control section and mounting/demounting head 25 is accurately moved in accordance with the data for storage positions.

Figure 16:
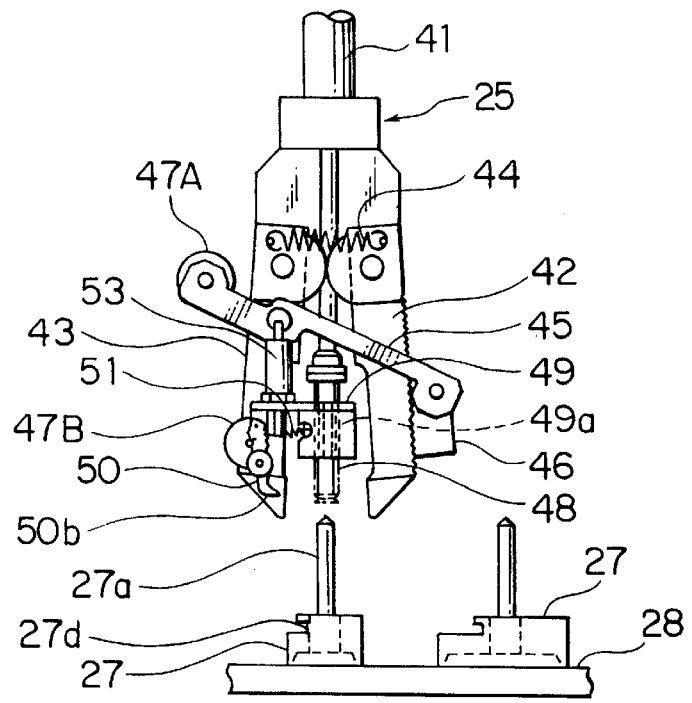
FIG. 16 is a block diagram showing a state in which the centering jig in FIG. 13 is released.
Figure 17:
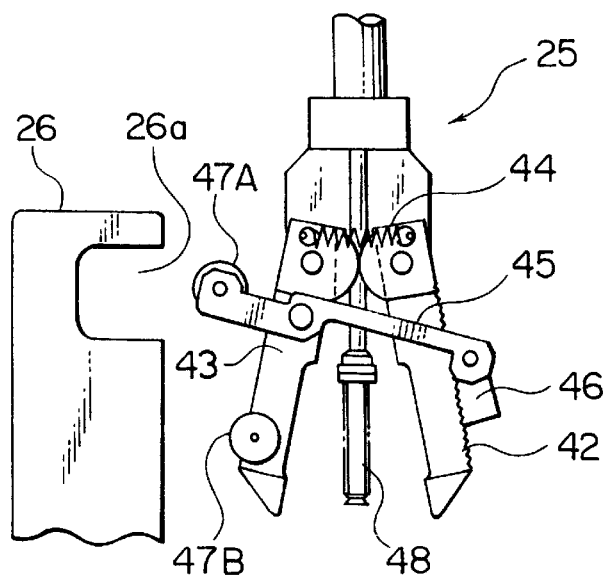
FIG. 17 is a block diagram of an essential portion of FIG. 1 showing a state in which the mounting/demounting head is moved to a positioning member.
Figure 18:
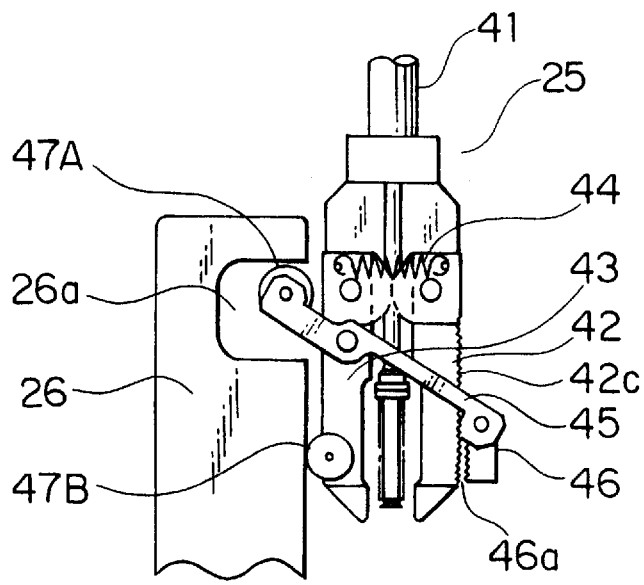
FIG. 18 is a block diagram of an essential portion of FIG. 17 showing a state in which the mounting/demounting head is pressed against a positioning member.

Thereafter, air cylinder 53 of mounting/demounting head 25 is operated to thereby rotate chuck 50 against spring 51 and release front end 50b of chuck 50 from engagement groove 27d of centering jig 27. In the above state, mounting/demounting head 25 is moved upward and, as shown in FIG. 16, positioning pin 27a is thereby removed from positioning hole 49a and centering jig 27 is released from mounting/demounting head 25. Then, as shown in FIG. 17, mounting/demounting head 25 is moved to the side of positioning member 26 so that first roller 47A faces recess 26a (step S3). The support structure of centering jig 27 is not illustrated in FIGS. 17 to 21. Thereafter, mounting/demounting head 25 is moved toward positioning member 26, first roller 47A is inserted into recess 26a, and second roller 47B is pressed against positioning member 26. As shown in FIG. 18, second socket pusher 43 is thereby closed against spring 44, first socket pusher 42 synchronizing with holder 43 is also closed, engagement between engagement surface 42c and engagement surface 46a is released, and stopper 46 is separated from first socket pusher 42 (step S4).

Figure 19:
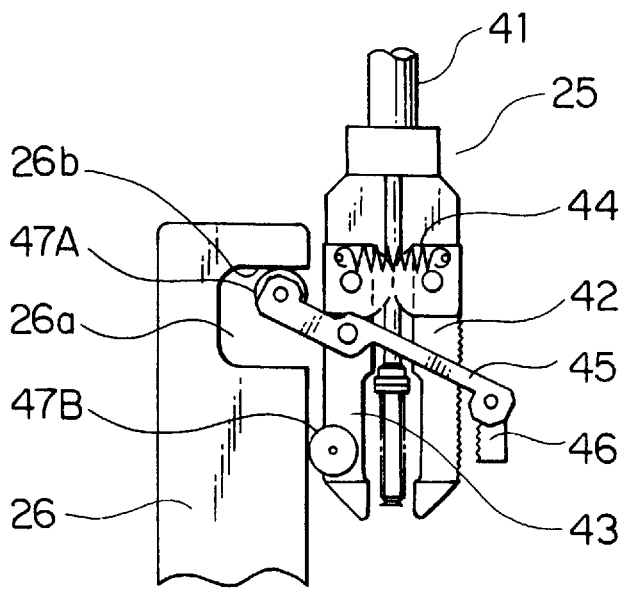
FIG. 19 is a block diagram of an essential portion of FIG. 17 showing a state in which the mounting/demounting head is raised.

Thereafter, as shown in FIG. 19, mounting/demounting head 25 is moved upward and first roller 47A contacts the upside of recess 26a, that is, positioning surface 26b. When mounting/demounting head 25 is further moved upward from the above state (step S5), lever 45 is rotated counterclockwise. Because the moving distance of mounting/demounting head 25 corresponding to the type of IC 13 is previously stored in the control section, mounting/demounting head 25 is stopped at a set height.

Figure 20:
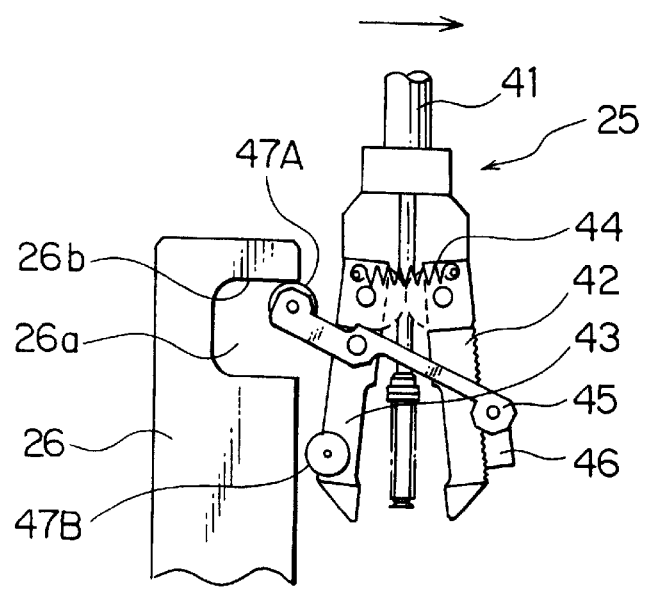
FIG. 20 is a block diagram of an essential portion of FIG. 17 showing a state in which the mounting/demounting head is horizontally moved.
Figure 21:
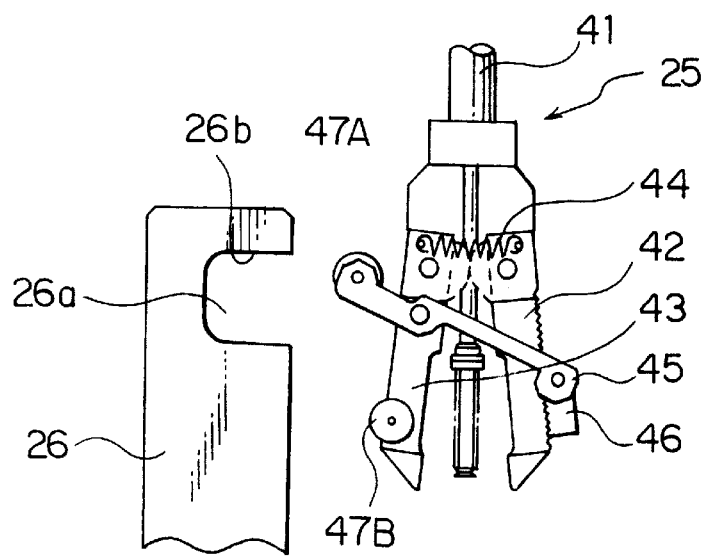
FIG. 21 is a block diagram of an essential portion of FIG. 17 showing a state in which the mounting/demounting head is separated from a positioning member.

Thereafter, as shown in FIG. 20, mounting/demounting head 25 is moved horizontally in the direction away from positioning member 26 and thereby, first and second socket pushers 42 and 43 are rotated in the opening direction by the restoring force of spring 44, and stopper 46 is reconnected to first socket pusher 42 (step S6). Then, mounting/demounting head 25 is further moved horizontally away from positioning member 26 as shown in FIG. 21 and the change of the degree of opening between first and second socket pushers 42 and 43, that is, the interval between the bottom ends of socket pushers 42 and 43 is thereby completed.

In this case, the degree of opening between first and second socket pushers 42 and 43 is adjusted in accordance with the position of stopper 46 to first socket pusher 42 and the position of stopper 46 is adjusted in accordance with the angle of lever 45. Moreover, the angle of lever 45 is adjusted in accordance with the rising distance of mounting/demounting head 25 from positioning surface 26b. Therefore, it is possible to obtain degree of opening corresponding to the type of IC 13 by inputting and storing the height when mounting/demounting head 25 rises in the control section for each type of IC 13.

Figure 22:
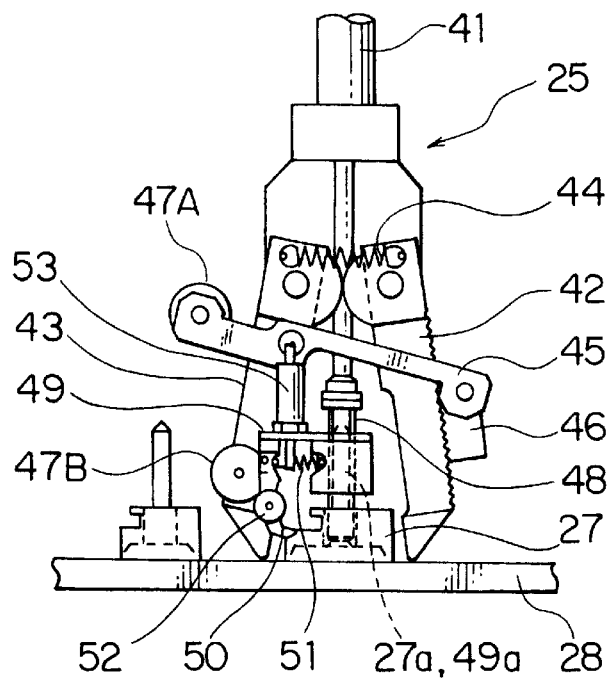
FIG. 22 is a block diagram showing a state in which the mounting/demounting head in FIG. 21 is lowered onto a centering jig.

Therefore, when opening-degree change is completed, mounting/demounting head 25 is moved to centering-jig stocker 28 again (step S7). In this case, mounting/demounting head 25 is accurately positioned just above the storage position on the stocker 28 of the centering-jig to be mounted next. Then, while chuck 50 is rotated by air cylinder 53 against spring 51, mounting/demounting head 25 is lowered and positioning pin 27a is inserted into positioning hole 49a as shown in FIG. 22.

Figure 23:
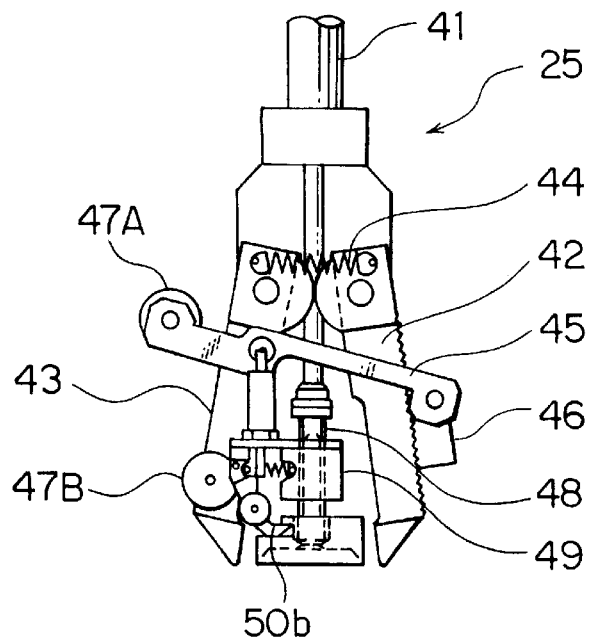
FIG. 23 is a block diagram showing a state in which mounting of the centering jig in FIG. 22 is completed.

Thereafter, as shown in FIG. 23, the urging by air cylinder 53 is canceled and thereafter, chuck 50 is rotated by spring 51, front end 50b of chuck 50 engages with engagement groove 27d, and setting of centering jig 27 is completed (step S8). The replacement of centering jigs 27 and adjustment of the opening degree between socket pushers 42 and 43 are thereby completed and mounting/demounting head 25 can mount or demount the selected type of IC 13.

With the IC mounting/demounting system having the above mounting/demounting head 25, it is unnecessary to replace the whole mounting/demounting head 25 even when the type of IC is changed. Therefore, it is possible to eliminate the replacement time needed for mounting/demounting head 25 to greatly improve the operation efficiency.

Moreover, by storing information for IC's and IC sockets in the control section, replacement of centering jigs 27 and adjustment of the opening degree between socket pushers 42 and 43 are automatically performed to therefore further improve the operation efficiency.

Furthermore, because the degree of opening between socket pushers 42 and 43 can be adjusted in accordance with the distance mounting/demounting head 25 moves from positioning member 26 with positioning surface 26b, it is possible to adjust the degree opening with greater accuracy.

Furthermore, because locked centering jig 27 can be unlocked by rotating chuck 50 with air cylinder 53, it is possible to quickly mount or demount centering jig 27 in a small space. Furthermore, it is also possible to manually replace centering jigs 27 by omitting air cylinder 53 and manually rotating chuck 50.

Also, the degree of opening can be easily adjusted because a pair of socket pushers 42 and 43 rotate synchronously with timing gears 42b and 43b.

Although, in the case of the above embodiment, a burn-in process is shown, it is also possible to apply the system of the present invention to electrical operation tests to be performed before and after a burn-in process when it is necessary to mount or demount an IC on or from an IC socket.

EMBODIMENT 2

Figure 24:
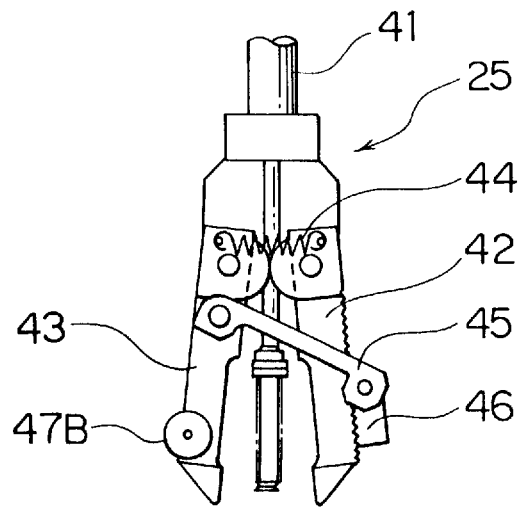
FIG. 24 is a block diagram showing an essential portion of the mounting/demounting head of embodiment 2 of the present invention.

In the case of the above embodiment, means for automatically adjusting the interval between socket pushers 42 and 43 is shown. However, it is also possible to use means for manually adjusting the interval. That is, as shown in FIG. 24, it is possible to manually adjust the position of stopper 46 by omitting the first roller and using a jig or the like. In this case, it is also possible to record the connective position of stopper 46 corresponding to the type of IC on socket pusher 42.

EMBODIMENT 3

Figure 25:
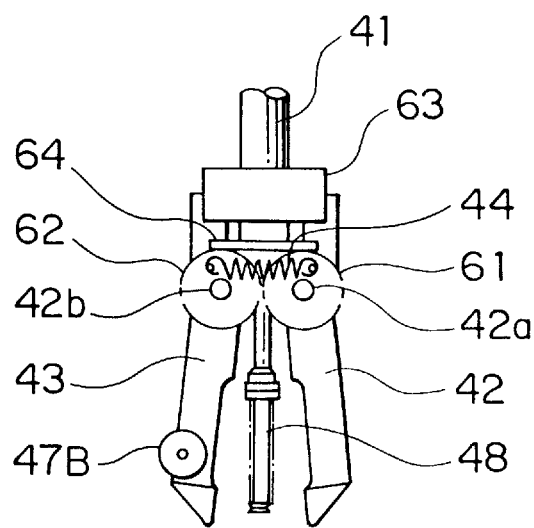
FIG. 25 is a block diagram showing an essential portion of the mounting/demounting head of embodiment 3 of the present invention.

FIG. 25 is a block diagram showing an essential portion of the mounting/demounting head of embodiment 3 of the present invention. In FIG. 25, timing gears 61 and 62 to be engaged with each other when a pair of socket pushers 42 and 43 rotate are set to the top ends of holders 42 and 43. Rack 64 serving as an interval keeping member to be vertically moved by air cylinder 63 is pressed against timing gears 61 and 62. Other structures are almost the same as those of the above embodiment 1.

Figure 26:
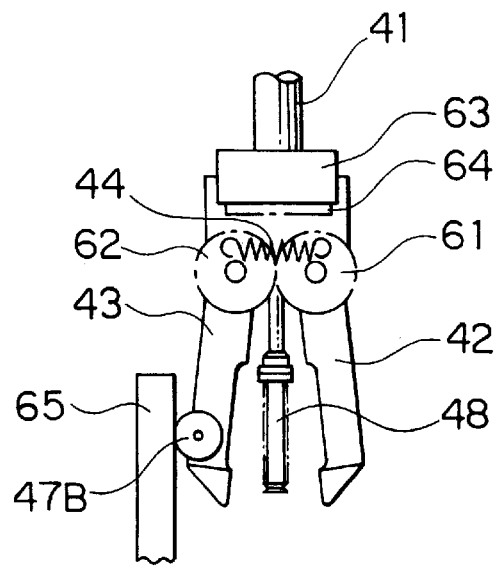
FIG. 26 is a block diagram showing a state in which the mounting/demounting head in FIG. 25 is pressed against a positioning member.
Figure 27:
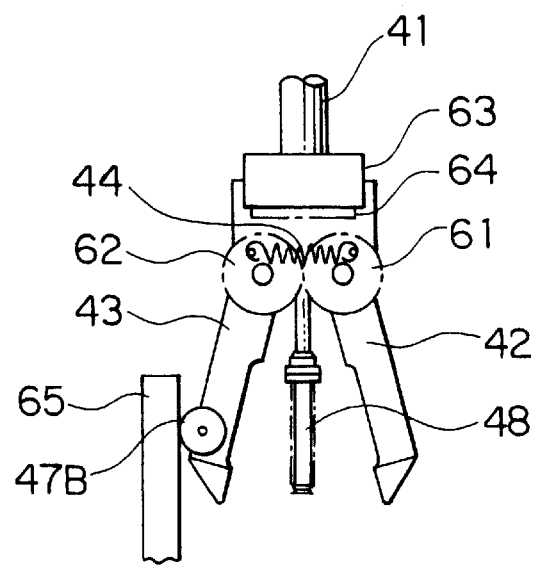
FIG. 27 is a block diagram of an essential portion of FIG. 26 showing a state in which the mounting/demounting head is moved horizontally.

In the case of the above mounting/demounting head, the interval between socket pushers 42 and 43 is kept by rack 64. Therefore, to change the interval, rack 64 is separated from timing gears 61 and 62 by air cylinder 63 and thereafter, as shown in FIG. 26, roller 47B is pressed against positioning member 65 having a plane to close socket pushers 42 and 43 against spring 44. Thereafter, as shown in FIG. 27, the mounting/demounting head is moved up to a set value and when a proper opening degree is obtained, air cylinder 63 is operated to lock timing gears 61 and 62.

Even by using the above mounting/demounting head, it is possible to automatically adjust the interval between socket pushers 42 and 43 similar to the case of embodiment 1 and thus, the operation efficiency is improved.

Though the above embodiment uses rack 64 as an interval keeping member, it is also possible to use merely a frictional material as long as the material can stop rotation of timing gears 61 and 62 against spring 44 and thereby, the opening degree can be continuously adjusted.

EMBODIMENT 4

Figure 28:
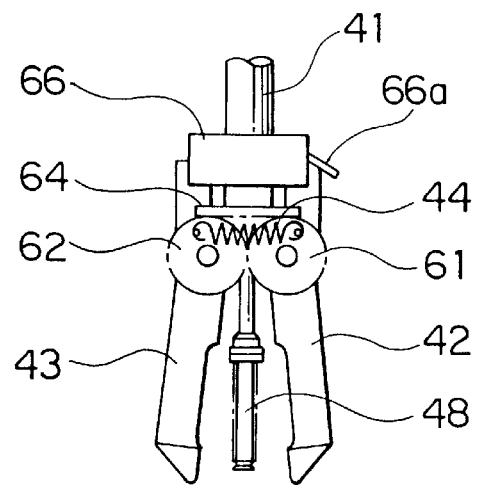
FIG. 28 is a block diagram showing an essential portion of the mounting/demounting head of embodiment 4 of the present invention.

In the case of the above embodiment, rack 64 is moved by air cylinder 63. However, as shown in FIG. 28, it is also possible to press rack 64 against timing gears 61 and 62 by pressing unit 66 having operation lever 66a. In this case, by changing positions of operation lever 66a, rack 64 is moved upward and timing gears 61 and 62 are unlocked. Moreover, the interval between socket pushers 42 and 43 is manually adjusted by a jig for adjusting the interval to a value corresponding to the type of product.

EMBODIMENT 5

Figure 29:
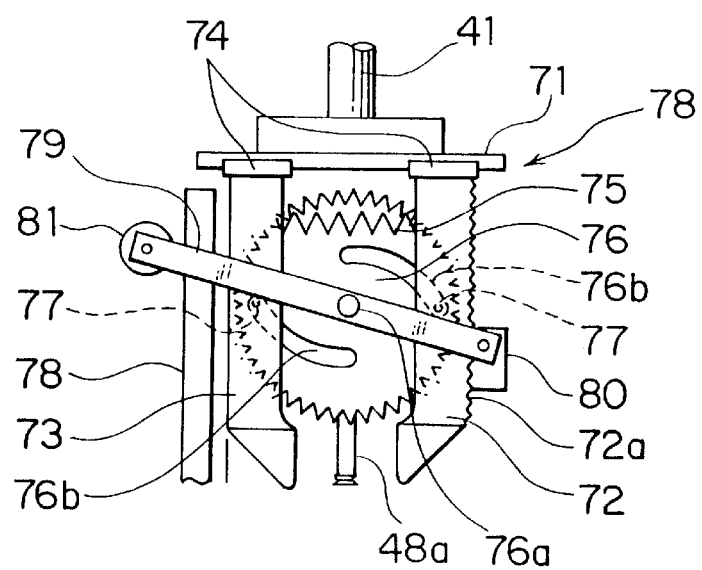
FIG. 29 is a block diagram showing an essential portion of the mounting/demounting head of embodiment 5 of the present invention.

FIG. 29 is a block diagram showing an essential portion of the mounting/demounting head of embodiment 5 of the present invention. In FIG. 29, guide rail 71 extending in the horizontal direction is secured to the bottom end of head shaft 41. A pair of socket pushers, that is, first and second socket pushers 72 and 73 are set to guide rail 71 in parallel to each other through guide member 74. These socket pushers 72 and 73 can be moved linearly along guide rail 71. Moreover, first socket pusher 72 is provided with engagement surface 72a.

Spring 75 is set between first and second socket pushers 72 and 73 so that they are separated from each other. Gear 76 rotatable about fulcrum 76a is mounted to a support portion (not illustrated) secured to head shaft 41. A pair of cam grooves 76b are symmetrically provided around fulcrum 76a in gear 76. Engaging pins 77 secured to socket pushers 72 and 73 slidably engage with cam grooves 76b respectively. Gear 76 is rotated by engaging the teeth on the outer periphery thereof with teeth of positioning rack 78 and simultaneously moving the mounting/demounting head vertically.

Linearly moving mechanism 78 of this embodiment comprises guide rail 71, guide members 74, gear 76, and engaging pins 77. Rodlike lever 79 is rotatably mounted to fulcrum 76a of gear 76, stopper 80 engaging with engagement surface 72a is rotatably mounted to one end of lever 79, and roller 81 is rotatably mounted to the other end of lever 79.

In the case of the above mounting/demounting head, gear 76 is rotated by engaging gear 76 with positioning rack 78 to simultaneously change heights of the mounting/demounting head, socket pushers 72 and 73 are moved by interlocking with gear 76, and the degree of opening is adjusted. The degree of opening is locked by engaging stopper 80 with engagement surface 72a of first socket pusher 72.

In the case of this embodiment, because the degree of opening between first and second socket pushers 72 and 73 is adjusted not by rotation but by linear motion, the position of the front ends of socket pushers 72 and 73 in relation to the front end of suction pad 48a in the height direction is kept constant independent of the degree of opening. This also prevents the pressing force of suction pad 48a against an IC from changing.

EMBODIMENT 6

Figure 30:
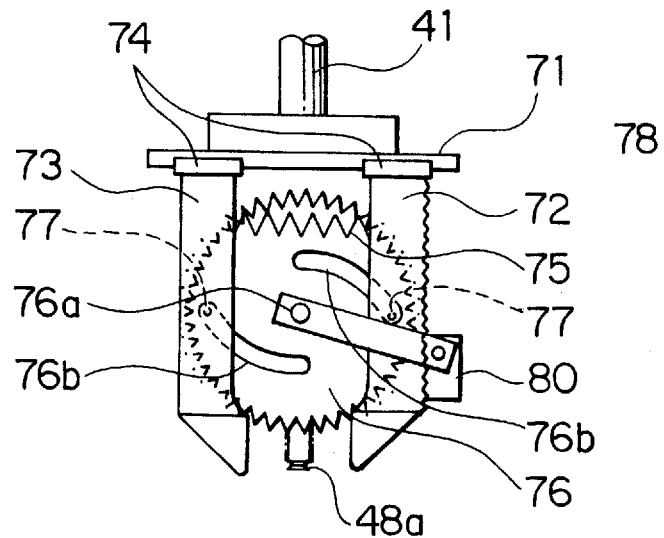
FIG. 30 is a block diagram showing an essential portion of the mounting/demounting head of embodiment 6 of the present invention.

In the case of the above embodiment 5, the interval between socket pushers 72 and 73 is automatically adjusted. However, it is also possible to manually adjust the interval by a jig or the like. In this case, it is possible to use the structure shown in FIG. 30 and manually rotate gear 76 by manually releasing stopper 80.

EMBODIMENT 7

Figure 31:
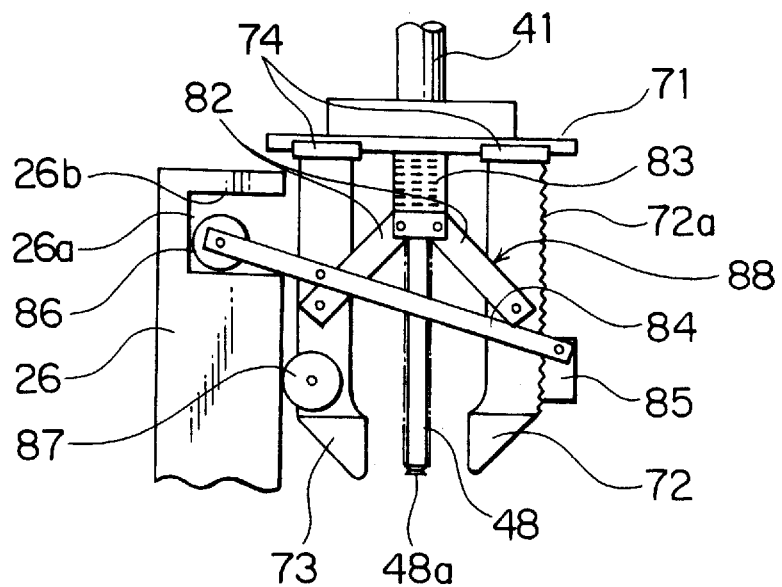
FIG. 31 is a block diagram showing an essential portion of the mounting/demounting head of embodiment 7 of the present invention.

FIG. 31 is a block diagram showing an essential portion of the mounting/demounting head of embodiment 7 of the present invention. In FIG. 31, first and second socket pushers 72 and 73 are synchronously opened or closed by linkages 82. Moreover, socket pushers 72 and 73 are pressed by spring 83 through linkages 82 in the open direction. Lever 84 is rotatably set to second stopper 73. Stopper 85 engaging with engagement surface 72a is rotatably set to one end of lever 84 and first roller 86 is rotatably set to the other end of lever 84. Furthermore, second roller 87 is set to second socket pusher 73. Linearly moving mechanism 88 of this embodiment comprises guide rail 71, guide members 74, and linkages 82.

In the case of the above mounting/demounting head, second roller 87 is pressed against positioning member 26 as in embodiment 1 to separate stopper 85 and then the mounting/demounting head is raised up to a preset height to rotate lever 84. Thereafter, by horizontally moving the mounting/demounting head, socket pushers 72 and 73 are moved linearly up to the position of stopper 85 and the degree of opening is adjusted. Therefore, the opening-degree adjustment efficiency is improved similar to the other embodiments. Moreover, because the degree of opening between first and second socket pushers 72 and 73 is adjusted in accordance with linear movement, the pressing force of suction pad 48a against an IC is prevented from changing. Furthermore, the structure is simplified because the pair of socket pushers 72 and 73 are synchronized by linkage 82.

EMBODIMENT 8

Figure 32:
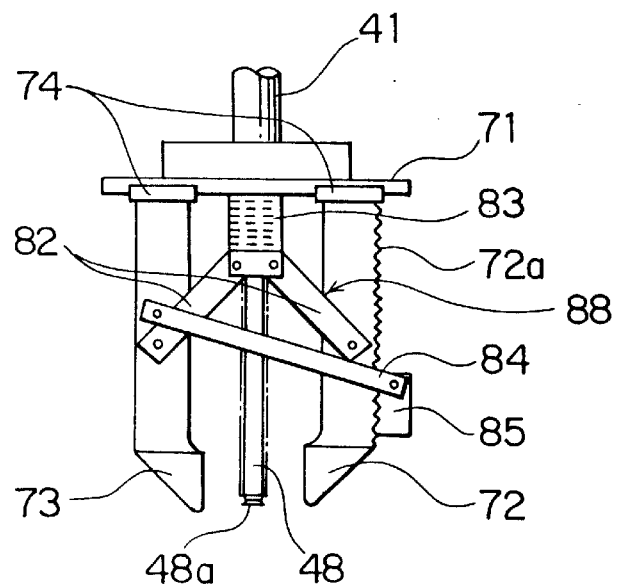
FIG. 32 is a block diagram showing an essential portion of the mounting/demounting head of embodiment 8 of the present invention.

In the case of the above embodiment 7, the interval between socket pushers 72 and 73 is automatically adjusted. However, it is also possible to manually adjust the interval by a jig or the like. In this case, it is possible to use the structure shown in FIG. 32 and manually move socket pushers 72 and 73 by manually releasing stopper 85.

EMBODIMENT 9

Figure 33:
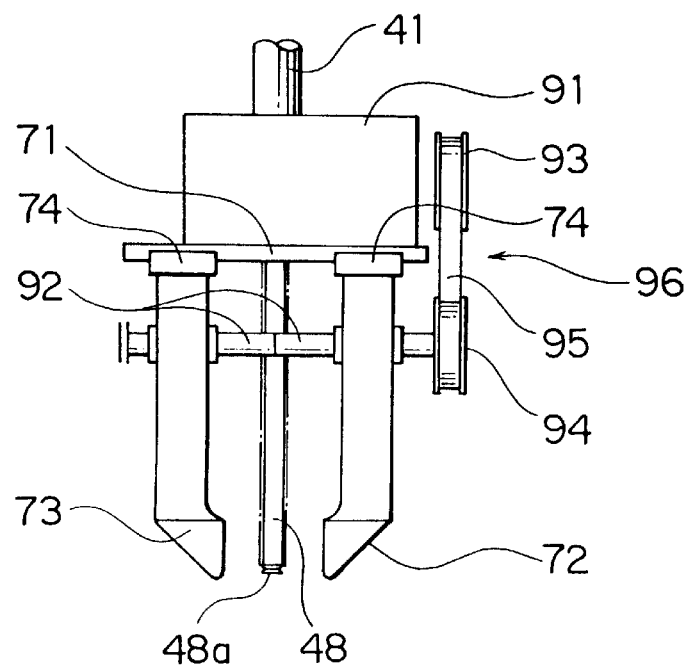
FIG. 33 is a block diagram showing an essential portion of the mounting/demounting head of embodiment 9 of the present invention.
Figure 34:
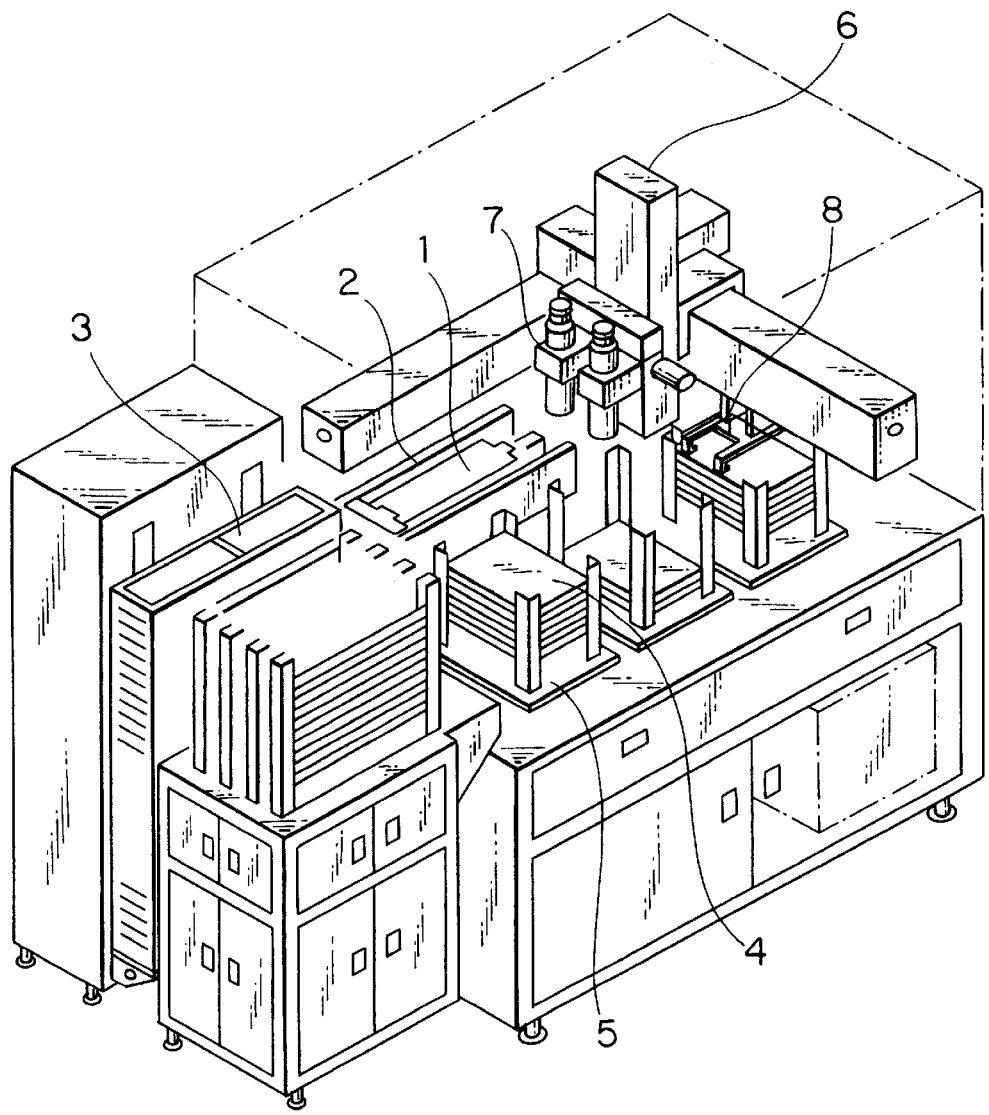
FIG. 34 is a perspective view showing a conventional IC mounting/demounting system.

FIG. 33 is a block diagram showing an essential portion of the mounting/demounting head of embodiment 9 of the present invention. In FIG. 33, pulse motor 91 is secured to head shaft 41. Ball screw 92 is screwed to a pair of linearly moving socket pushers 72 and 73 respectively along guide rail 71. The portion of ball screw 92 screwed to first socket pusher 72 and the portion of ball screw 92 screwed to second socket pusher 73 are threaded in the opposite direction to each other. Therefore, when ball screw 92 rotates, first and second socket pushers 72 and 73 move in the opposite direction to each other, that is, move so as to open or close. The driving force of pulse motor 91 is transferred to ball screw 92 through timing belt 95. Linearly moving mechanism 96 of this embodiment comprises guide rail 71, guide members 74, pulse motor 91, ball screws 92, pulleys 93 and 94, and timing belt 95.

In the case of the above mounting/demounting head, ball screws 92 are rotated by pulse motor 91 to automatically adjust the interval between socket pushers 72 and 73. Moreover, operational information for pulse motor 91 for obtaining the interval between socket pushers 72 and 73 corresponding to the type of IC is stored in the control section, pulse motor 91 is turned on only for a necessary time by inputting the type of the IC, and the interval between socket pushers 72 and 73 is changed to the preset value.

What is claimed is:

1. An integrated circuit mounting/demounting system comprising:
   a tray supply section for supplying a tray on which an integrated circuit is mounted;
   a board supply section for supplying a socket board having an IC integrated circuit socket on which the integrated circuit can be mounted for testing by pressing and displacing a moving section of the socket which moves contacts of the socket;
   a robot body for transferring the integrated circuit between the tray supplied to the tray supply section and the socket board supplied to the board supply section;
   a mounting/demounting head supported by the robot body and having a pair of socket pushers movable by the robot body into and out of contact with the moving section of the socket to depress the moving section, an interval between the socket pushers being adjustable in accordance with the size of the integrated circuit, a spring for pressing the socket pushers in a direction to increase the interval between the socket pushers, a lever rotatable mounted on of the socket pushers, and an interval control member disposed at a first end of the lever to control the interval between the socket rushers in accordance with an angle of the lever; and
   a control section for controlling the robot body.

2. The integrated circuit mounting/demounting system according to claim 1, wherein the interval between the socket pushers is automatically adjusted by inputting information for either the integrated circuit or integrated circuit socket to a control section.

3. The integrated circuit mounting/demounting system according to claim 2, wherein:
   the mounting/demounting head has a roller disposed at a second end of the lever;
   a positioning member having a positioning surface is provided within a range of movement by the robot body; and
   the lever is rotated and the interval between the socket pushers is adjusted by bringing the roller into contact with the positioning surface and simultaneously moving the mounting/demounting head by the robot body.

4. The integrated circuit mounting/demounting system according to claim 1, including a centering-jig stocker on which a plurality of centering jigs are mounted, each centering jig being capable of attachment to the mounting/demounting head for centering the integrated circuit, and a centering jig corresponding to an appropriate integrated circuit is automatically selected and exchanged by inputting information for the integrated circuit into the control section.

5. The integrated circuit mounting/demounting system according to claim 4, wherein the mounting/demounting head has a chuck for holding one of the centering jigs and an air cylinder for opening or closing the chuck.

6. The integrated circuit mounting/demounting system according to claim 1, wherein the tray supply section has a tray lifting unit for selectively lifting either a set tray magazine or a tray housed in the tray magazine.

7. The integrated circuit mounting/demounting system according to claim 6, wherein the tray supply section has a tray table provided with a rotatable tray receiver supporting two trays, an empty tray housing section for housing an empty tray, a tray lifting unit, and a tray transfer unit for transferring a tray between the tray table and the empty tray housing section.

8. Then integrated circuit mounting/demounting system according to claim 1, wherein the board supply section has a board reversing unit for exchanging positions of a socket board between an integrated circuit mounting/demounting position and a socket board replacing position while keeping the socket board horizontal.

9. The integrated circuit mounting/demounting system according to claim 1, wherein the socket pushers are pivotable with respect to each other to vary the interval between them.

10. The integrated circuit mounting/demounting system according to claim 1, wherein the socket pushers are movable with respect to each other along a linear path while remaining parallel to each other to vary the interval between them.

11. The integrated circuit mounting/demounting system comprising:

a tray supply section for supplying a tray on which an integrated circuit is mounted;

a board supply section for supplying a socket board having an integrated circuit socket on which the integrated circuit can be mounted for testing by pressing and displacing a moving section of the socket which moves contacts of the socket;

a robot body for transferring the integrated circuit between the tray supplied to the tray supply section and the socket board supplied to the board supply section;

a mounting/demounting head supported by the robot body and having a pair of socket pushers movable by the robot body into and out of contact with the moving section of the socket to depress the moving section, an interval between the socket pushers being adjustable in accordance with the size of the integrated circuit, a spring for pressing the socket pushers in a direction to increase the interval between the socket pushers, timing gears for synchronously displacing the socket pushers when adjusting the interval between the socket pushers, and an interval control member movable into and out of engagement with the timing gears, engagement between the interval control member and the timing gears preventing rotation of the timing gears to maintain the interval between the socket pushers; and a control section for controlling the robot body.

12. An integrated circuit mounting/demounting system comprising:

a tray supply section for supplying a tray on which an integrated circuit is mounted;

a socket board having an integrated circuit socket on which an integrated circuit can be mounted for testing by pressing and displacing a moving section of the socket which moves contacts of the socket;

a robot body for transferring the integrated circuit between the tray supplied to the tray supply section and the socket board;

a mounting/demounting head supported by the robot body and having a plurality of socket pushers movable by the robot body into and out of contact with the moving section of the socket to depress the moving section, an interval between the socket pushers being adjustable in accordance with the size of the integrated circuit; and a control section for controlling the robot body.

13. The integrated circuit mounting/demounting system according to claim 12, wherein the socket pushers are pivotable with respect to each other to vary the interval between them.

14. The integrated circuit mounting/demounting system according to claim 12, wherein the socket pushers are movable with respect to each other along a linear path while remaining parallel to each other to vary the interval between them.

* * * * *

UNITED STATES PATENT AND TRADEMARK OFFICE
CERTIFICATE OF CORRECTION

PATENT NO. : 5,822,847
DATED : October 20, 1998
INVENTOR(S) : Arakawa et al.

It is certified that error appears in the above-identified patent and that said Letters Patent is hereby corrected as shown below:

Column 12, Line 23, delete "IC";

Line 39, after "on" insert --one--;

Line 41, change "rushers" to --pushers--;

Column 14, Line 29, insert after "a" --support portion for supporting an integrated circuit and a--;

Line 29, after "pushers" insert --each having a contact portion for contacting the moving section of the socket, the mounting/demounting head being--;

Line 30, after "body" insert --to bring the contact portions of the socket pushers--;

Line 31 and 32, delete "an interval between";

UNITED STATES PATENT AND TRADEMARK OFFICE
CERTIFICATE OF CORRECTION

PATENT NO. : 5,822,847
DATED : October 20, 1998
INVENTOR(S) : Arakawa et al.

It is certified that error appears in the above-identified patent and that said Letters Patent is hereby corrected as shown below:

Line 32 change "adjustable" to --movable with respect to the support portion to vary a separation between the contact portions of the socket pushers--;

Line 33, after "circuit" insert --supported by the support portion--;

Line 37, change "interval" to --separation--;

Line 38, change "them" to --the contact portions--;

UNITED STATES PATENT AND TRADEMARK OFFICE
CERTIFICATE OF CORRECTION

PATENT NO. : 5,822,847
DATED : October 20, 1998
INVENTOR(S) : Arakawa, et al

It is certified that error appears in the above-identified patent and that said Letters Patent is hereby corrected as shown below:

Line 42, change "interval" to --separation--;

Line 43, change "them" to --the contact portions--.

Signed and Sealed this

Second Day of March, 1999

Attest:

Q. TODD DICKINSON

*Attesting Officer*    Acting Commissioner of Patents and Trademarks